United States Patent
Jeong et al.

(10) Patent No.: US 8,400,216 B2
(45) Date of Patent: Mar. 19, 2013

(54) 3-WAY DOHERTY POWER AMPLIFIER USING DRIVING AMPLIFIER

(75) Inventors: Yoon Ha Jeong, Pohang-si (KR); Sang Ho Kam, Gimhae-si (KR); Yong Sub Lee, Pohang-si (KR); Mun Woo Lee, Daegu-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 0 days.

(21) Appl. No.: 13/286,818

(22) Filed: Nov. 1, 2011

(65) Prior Publication Data

US 2012/0112833 A1 May 10, 2012

(30) Foreign Application Priority Data

Nov. 5, 2010 (KR) .......... 10-2010-0109785
Oct. 26, 2011 (KR) .......... 10-2011-0109864

(51) Int. Cl.
*H03F 3/68* (2006.01)

(52) U.S. Cl. .................... 330/124 R; 330/295

(58) Field of Classification Search .......... 330/124 R, 330/295
See application file for complete search history.

(56) References Cited

U.S. PATENT DOCUMENTS

| | | | | |
|---|---|---|---|---|
| 6,085,074 | A * | 7/2000 | Cygan ............ | 455/241.1 |
| 7,345,537 | B2 * | 3/2008 | Apel et al. ............ | 330/134 |
| 7,847,630 | B2 * | 12/2010 | Okubo et al. ............ | 330/124 R |
| 7,884,668 | B2 * | 2/2011 | Blednov ............ | 330/124 R |
| 8,022,760 | B2 * | 9/2011 | Gajadharsing et al. ... | 330/124 R |
| 8,154,339 | B2 * | 4/2012 | Zolghadri et al. ......... | 330/124 R |
| 2003/0141933 | A1 * | 7/2003 | Pengelly ............ | 330/295 |
| 2006/0097783 | A1 | 5/2006 | Okubo et al. | |
| 2011/0068865 | A1 * | 3/2011 | Mohamadi et al. ....... | 330/124 R |
| 2011/0175677 | A1 | 7/2011 | Jeong et al. | |

FOREIGN PATENT DOCUMENTS

| | | |
|---|---|---|
| EP | 1677414 A1 | 7/2006 |
| EP | 2117119 A1 | 11/2009 |
| JP | 2006-197556 | 7/2006 |

(Continued)

OTHER PUBLICATIONS

European Search Report for Application No. EP 11 18 7441 dated Feb. 23, 2012.

(Continued)

*Primary Examiner* — Patricia Nguyen
(74) *Attorney, Agent, or Firm* — Kile Park Goekjian Reed & McManus PLLC (57) ABSTRACT

Disclosed is a 3-way Doherty power amplifier using a driving amplifier in which driving amplifiers are connected to the front stages of a carrier amplifier and a peaking amplifier, respectively, so as to obtain a high gain and a high efficiency. To this end, the Doherty power amplifier includes: a hybrid power distributor for distributing an input signal into first and second path units; and a driving amplifier for receiving a signal outputted from the hybrid power distributor and controlling the driving of a carrier amplifier, a first peaking amplifier, and a second peaking amplifier, wherein: the carrier amplifier, the first peaking amplifier, and the second peaking amplifier are connected to a rear stage of the driving amplifier, respectively; the first path unit generates a high efficiency at a low input power; and the second path unit maintains a high efficiency and gain in a high output range.

16 Claims, 6 Drawing Sheets

FOREIGN PATENT DOCUMENTS

| | | |
|---|---|---|
| JP | 2008-199625 | 8/2008 |
| WO | 01/95481 A1 | 12/2001 |
| WO | 2005/088830 A1 | 9/2005 |
| WO | 2009/081341 A1 | 7/2009 |

OTHER PUBLICATIONS

A New Wideband Distributed Doherty Amplifier for WCDMA Repeater Applications, Yong-Sub Lee et al., IEEE Microwasve and Wireless Components Letters, vol. 19, No. 10, Oct. 2009, pp. 668-670.

A Highly Efficient Doherty Feedforward Linear Power Amplifier for W-CDMA Base-Station Applications, Kyoung-Joon Cho et al., IEEE Transactions on Microwave Theory and Techniques, vol. 53, No. 1, Jan. 2005, pp. 292-300.

* cited by examiner

3-WAY DOHERTY POWER AMPLIFIER USING DRIVING AMPLIFIER

BACKGROUND OF THE INVENTION

1. Field of the Invention

The present invention relates to a 3-way Doherty power amplifier using a driving amplifier, and more particularly, to a 3-way Doherty power amplifier using a driving amplifier in which driving amplifiers are connected to the front stages of a carrier amplifier and a peaking amplifier, respectively, which constitute the Doherty power amplifier, so as to obtain a high gain and a high efficiency.

2. Description of the Related Art

Doherty power amplifiers exhibit a high efficiency at a relatively low output power, so that Doherty power amplifiers are being widely researched even now. However, modulation signals used in a recent communication system have a high peak-to-average power ratio (PAPR) of 9 dB or higher while general Doherty power amplifiers are limited to having a high efficiency at 6 dB back-off power (BOP), so that, in order to compensate therefor, Doherty power amplifiers with a more expanded concept have been proposed. As methods for providing a high efficiency at a higher BOP, N-way and asymmetric Doherty power amplifiers have been developed. However, these Doherty power amplifiers also have a disadvantage in that, after a high efficiency is generated in a BOP domain, gain and efficiency are reduced, and thus the maximum output power is generated.

Figure 1:
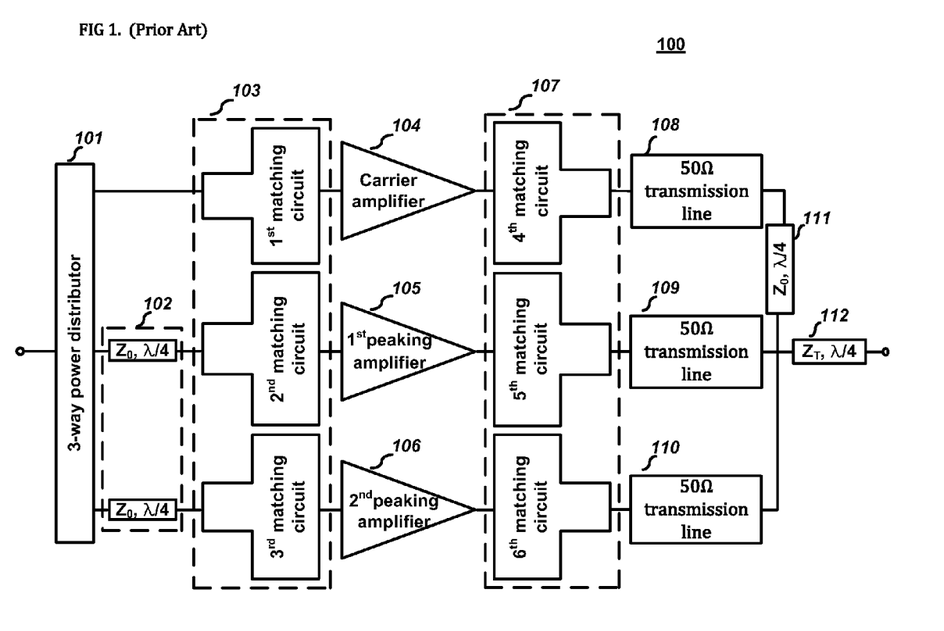
FIG. 1 is a circuit diagram illustrating the configuration of a conventional 3-way Doherty power amplifier.

FIG. 1 is a circuit diagram illustrating the configuration of a conventional 3-way Doherty power amplifier 100.

Referring to FIG. 1, an input signal is divided into signals having the same amplitude and into the respective transmission lines by a power distributor 101. The divided signals have a phase difference of 90 degrees by a λ/4 transmission line 102, which is disposed at the front ends of the input units of peaking amplifiers 105 and 106, and then are inputted to the first peaking 105 and second peaking amplifier 106, respectively. An input matching circuit 103 includes a first matching circuit, a second matching circuit, and a third matching circuit, which are located at the respective transmission lines and match the input impedances of amplifiers 104, 105, and 106, respectively. An output matching circuit 107 includes a fourth matching circuit, a fifth matching circuit, and a sixth matching circuit, which maximize the gains and efficiencies of the amplifier 104, 105, and 106, respectively.

When input power is in an input range lower than a preset value, the first peaking amplifier 105 and second peaking amplifier 106 do not operate, and only the carrier amplifier 104 operates. The preset value is predetermined by circuit designers.

In a low input range in which only the carrier amplifier 104 operates, the load impedance at the output terminal of the carrier amplifier 104 increases by a λ/4 transmission line 111.

In this case, in order to prevent the output of the carrier amplifier 104 from leaking to the first peaking amplifier 105 and second peaking amplifier 106, 50Ω transmission lines 109 and 110 are added to the output terminals of the first peaking amplifier 105 and second peaking amplifier 106, respectively. This allows an impedance viewed to the first peaking amplifier 105 and second peaking amplifier 106 from the output of the carrier amplifier 104 to have a high value.

In order to compensate for a signal delay by the 50Ω transmission lines 109 and 110 added to the respective peaking amplifiers, a 50Ω transmission line 108 is additionally connected to the output terminal of the carrier amplifier 104.

In addition, in order to achieve an impedance matching between the characteristic impedance of the 3-way Doherty amplifier and the output impedance of the carrier amplifier 104, the first peaking amplifier 105, and the second peaking amplifier 106, an output impedance transformation transmission line 112 is connected to the output.

When a power inputted to the 3-way Doherty power amplifier 100 becomes higher than a preset value, the carrier amplifier 104, the first peaking amplifier 105, and the second peaking amplifier 106 come to operate at the same time. Generally, an N-way Doherty power amplifier uses an N-way power distributor at the input stage thereof, and thus has the features that the gain of the carrier amplifier becomes low, and that the gain and efficiency thereof decrease until arriving at a saturation output power after a high efficiency is exhibited at a BOP.

Figure 2:
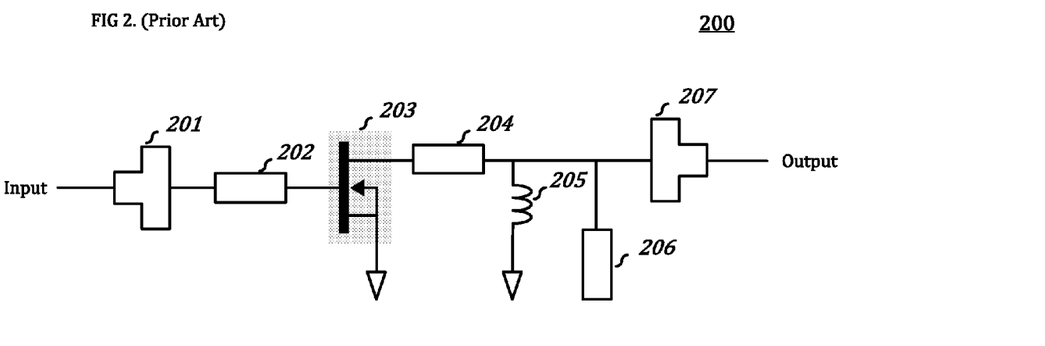
FIG. 2 is a circuit diagram explaining the configuration of a conventional inverse class-E power amplifier 200.

FIG. 2 is a circuit diagram illustrating the configuration of a conventional inverse class-E power amplifier 200.

Referring to FIG. 2, the input impedance of a power amplifier 203 is matched by an input matching circuit 201. The output impedance of a power amplifier 203 is matched by an output matching circuit 207. The second harmonic component of a signal inputted to the power amplifier 203 is minimized by a second harmonic adjustment line 202, all harmonic impedances becomes relatively lower than an input impedance by an output harmonic adjustment line 206, so that a high efficiency is obtained.

However, the aforementioned conventional 3-way Doherty power amplifier 203 has a characteristic of a high efficiency at a high BOP, but has a disadvantage in that the efficiency and gain decrease until a high efficiency is again exhibited in a maximum output range after the high efficiency has been exhibited in at a low output range. In addition, the soft turn-on phenomenon, which is the non-linear characteristic of elements, prevents the peaking amplifier from generating the maximum output power, thereby reducing the efficiency.

SUMMARY OF THE INVENTION

Accordingly, the present invention has been made in an effort to solve the problems occurring in the related art, and an object of the present invention is to provide a 3-way Doherty power amplifier using a driving amplifier, which can constantly generate a high efficiency and gain even in a wide output range.

Another object of the present invention is to provide a 3-way Doherty power amplifier using a driving amplifier, in which a class-AB biased driving amplifier is connected to the front stage of a carrier power amplifier, and a deep class-C biased driving amplifier is connected to the front stage of a peaking power amplifier, so that a high efficiency and gain in a wide output range can be obtained.

In order to achieve the above object, according to one aspect of the present invention, there is provided a 3-way Doherty power amplifier using a driving amplifier including: a first path unit and a second path unit which are divided from an input terminal; a driving carrier amplifier connected to the first path unit; a carrier amplifier connected to the driving carrier amplifier; a driving peaking amplifier connected to the second path unit; first and second peaking amplifiers connected in common to an output terminal of the driving peaking amplifier; first λ/4 transmission line connected to the carrier amplifier; and an output terminal to which the first λ/4 transmission line, the first peaking amplifier, and the second peaking amplifier are connected in common, wherein it is set in a first operating region that only the driving carrier amplifier and the carrier amplifier operate, it is set in a second operating region that the driving peaking amplifier and the first peaking amplifier operate additionally, and it is set in a third operating region that the second peaking amplifier operates further additionally.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Reference will now be made in greater detail to a 3-way Doherty power amplifier using a driving amplifier according to preferred embodiments of the invention, examples of which are illustrated in the accompanying drawings. Wherever possible, the same reference numerals will be used throughout the drawings and the description to refer to the same or like parts.

Figure 3:
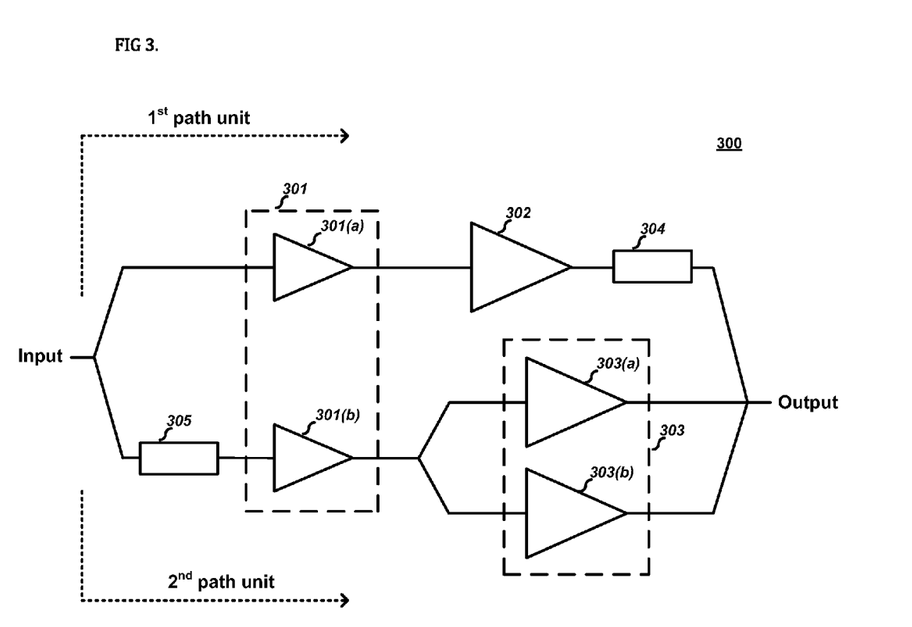
FIG. 3 is a circuit diagram illustrating the configuration of a 3-way Doherty power amplifier 300 using a driving amplifier according to the present invention.

FIG. 3 is a circuit diagram illustrating the configuration of a 3-way Doherty power amplifier 300 using a driving amplifier according to the present invention.

Referring to FIG. 3, the 3-way Doherty power amplifier 300 using a driving amplifier includes a driving amplifier 301, a carrier amplifier 302, a peaking amplifier 303, a first λ/4 transmission line 304, and a second λ/4 transmission line 305. The driving amplifier 301 includes a driving carrier amplifier 301(a) and a driving peaking amplifier 301(b). The peaking amplifier 303 includes a first peaking amplifier 303(a) and a second peaking amplifier 303(b).

The 3-way Doherty power amplifier 300 using a driving amplifier according to the present invention has two path units. A first path unit passes through the driving carrier amplifier 301(a) and the carrier amplifier 302. A second path unit passes through the driving peaking amplifier 301(b), and includes both paths passing through the first peaking amplifier 303(a) and second peaking amplifier 303(b) which are connected in parallel with each other.

In addition, according to the present invention, the 3-way Doherty power amplifier 300 using the driving amplifier has three operating regions. It is set in a first operating region that only the driving carrier amplifier 301(a) and the carrier amplifier 302 operate, it is set in a second operating region that the driving peaking amplifier 301(b) and the first peaking amplifier 303(a) operate additionally, and it is set in a third operating region that the second peaking amplifier 303(b) operates further additionally.

In a low input range, it is set that only the driving carrier amplifier 301(a) and carrier amplifier 302, which correspond to the first operating region, operate. In this case, the output impedance of the carrier amplifier 302 increases by the first λ/4 transmission line 304, and it is possible to acquire a high efficiency even in a relatively low output power range.

The driving carrier amplifier 301(a) and carrier amplifier 302 are biased to class AB.

The driving peaking amplifier 301(b) is biased to deep class-C so as to operate in an input range higher than that of the driving carrier amplifier 301(a). Accordingly, the first peaking amplifier 303(a) and second peaking amplifier 303(b), which receive the output of the driving peaking amplifier 301(b), operates at an input higher than that of the driving carrier amplifier 301(a), too. As the amplitude of an input increase, the driving peaking amplifier 301(b) corresponding to the second operating region starts operating, and the first peaking amplifier 303(a) also operates. Since the first peaking amplifier 303(a) has been set to have a weak class-C bias, the operating time point of the first peaking amplifier 303(a) is prior to that of the second peaking amplifier 303(b) having the deep class-C bias.

When the amplitude of the input further increases, the second peaking amplifier 303(b) also corresponding to the third operating region comes to operate. When the input is maximized, all of the driving amplifier 301, carrier amplifier 302, and peaking amplifier 303 operate, generating a higher efficiency than the case where the first path unit or only the first operating region in FIG. 3 operates.

In order to compensate for a phase delay exhibited between the carrier amplifier 302 and the peaking amplifier 303 due to the first λ/4 transmission line 304, the second λ/4 transmission line 305 is connected to the input of the driving peaking amplifier 301(b).

Figure 4:
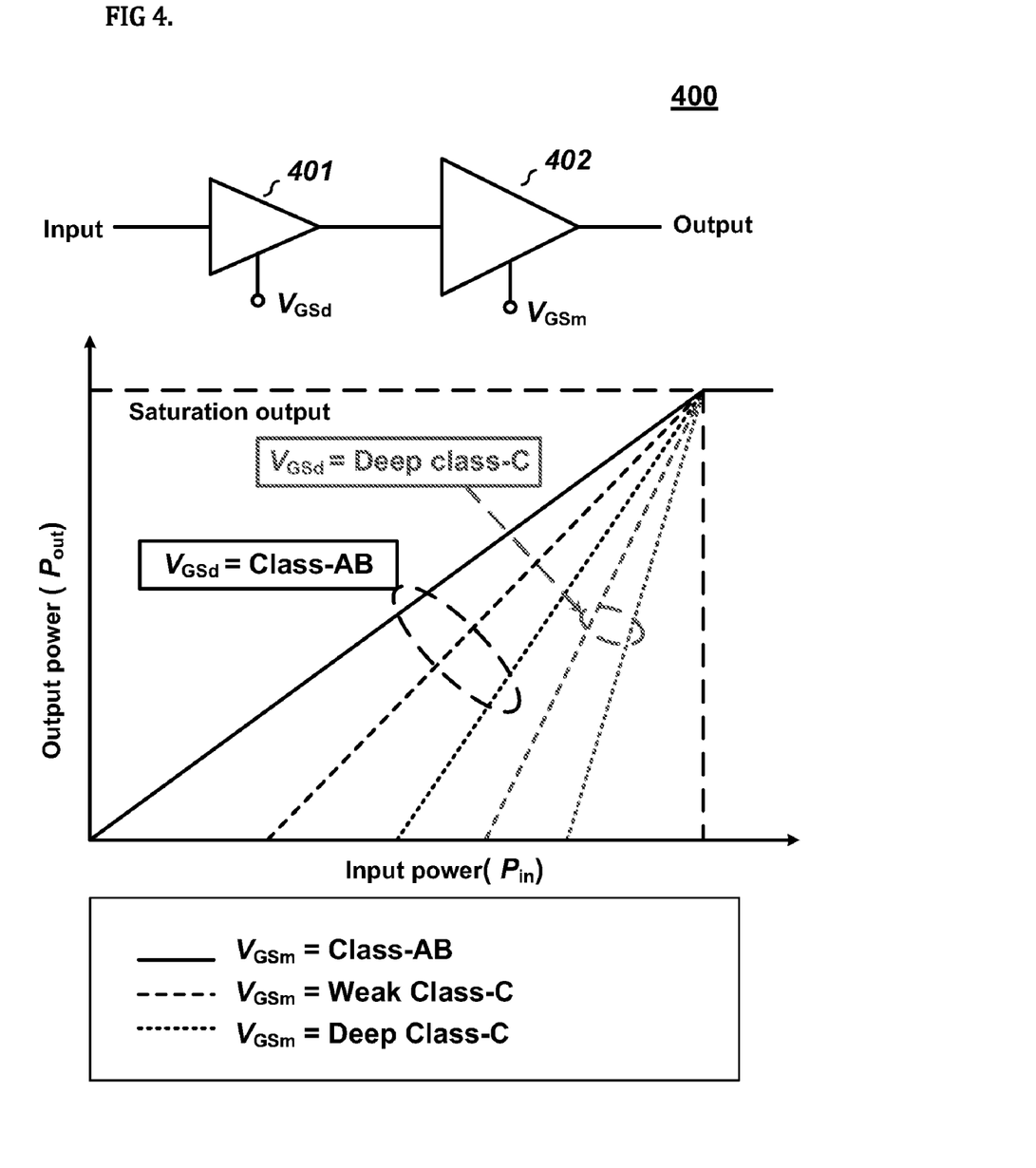
FIG. 4 is a graph illustrating the feature of a two-stage power amplifier according to the present invention, that exhibits different output power characteristics depending on input power.

An upper view in FIG. 4 is a circuit diagram simply illustrating the circuit of FIG. 3, which is the representative circuit of the present invention, as two stages. The driving amplifier 301 in FIG. 3 is simply illustrated as a driving power amplifier 401 in FIG. 4, and the carrier amplifier 302, first peaking amplifier 303(a), and second peaking amplifier 303(b) in FIG. 3 are simply illustrated as a main power amplifier 402 in FIG. 4.

A lower view in FIG. 4 illustrates output power characteristics according to biases of each amplifier in a two-stage power amplifier in which the driving power amplifier 401 and main power amplifier 402 are connected in series.

When the graph shown in FIG. 4 may be expressed as equation $$\Delta G = \frac{\Delta P_{out}}{\Delta P_{in}}$$

as shown in FIG. 4, which represents a change in a gate bias according to a change in the output power and a change in the input power When the outputs of the two-stage power amplifier 400 are compared while the main power amplifier 402 changes to the class-AB bias, to the weak class-C bias, and to the deep class-C bias at a state where the driving power amplifier 401 is fixed at the class-AB bias, it can be identified that, as the gate bias becomes lower and lower, a steeper slope is obtained as a result.

Similarly, when the outputs are compared while the main power amplifier 402 changes to the weak class-C bias and to the deep class-C bias at a state where the driving power amplifier 401 is fixed at the deep class-C bias, it can be identified that an output having a much steeper slope is obtained as a result.

The characteristic capable of adjusting the slope of the output may be used to compensate for the soft turn-on phenomenon, which is a non-linear characteristic of an element, thereby making it possible to maintain a high efficiency.

In addition, referring to FIG. 4, it can be identified that a weak class-C biased driving amplifier operates at a higher input power than a class-AB biased driving amplifier, and that a deep class-C biased driving amplifier operates at a higher input power than the weak class-C biased driving amplifier.

Figure 5:
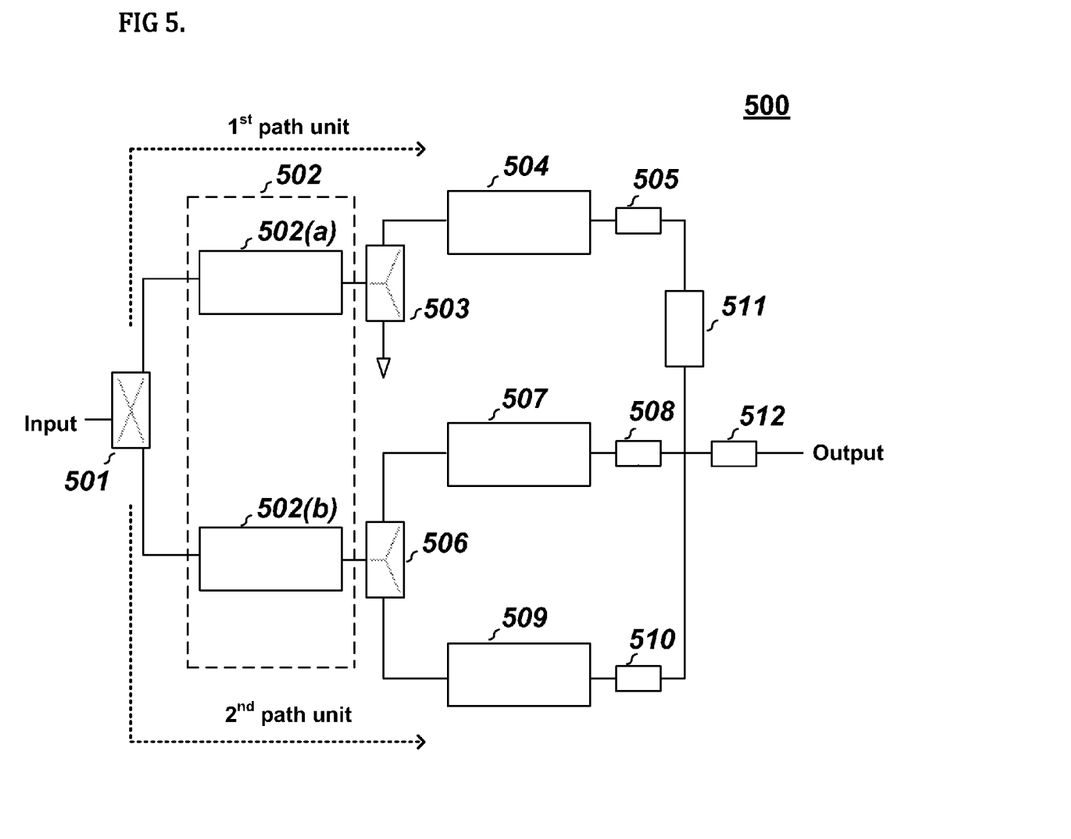
FIG. 5 is a circuit diagram illustrating the configuration of a 3-way Doherty power amplifier 500 using a driving amplifier according to the present invention.

FIG. 5 is a circuit diagram more specifically illustrating the configuration of a 3-way Doherty power amplifier 500 using a driving amplifier according to the present invention.

FIG. 5 includes a hybrid power distributor 501, a driving amplifier 502, a first power distributor 503, a carrier amplifier 504, a first transmission line 505, a second power distributor 506, a first peaking amplifier 507, a second transmission line 508, a second peaking amplifier 509, a third transmission line 510, a first λ/4 transmission line 511, and an output impedance transformation transmission line 512. The driving amplifier 502 includes a driving carrier amplifier 502($a$) and a driving peaking amplifier 502($b$).

The 3-way Doherty power amplifier 500 using a driving amplifier according to the present invention has two path units. A first path unit starts from the hybrid power distributor 501 and passes through the driving carrier amplifier 502($a$), the first power distributor 503, the carrier amplifier 504, the first transmission line 505, and the first λ/4 transmission line 511. A second path unit starts from the hybrid power distributor 501, passes through the driving peaking amplifier 502($b$) and the second power distributor 506, and includes both paths passing through the first peaking amplifier 507 and second peaking amplifier 509 which are connected in parallel with each other.

The hybrid power distributor 501 includes a second λ/4 transmission line 305 as shown in FIG. 3.

The 3-way Doherty power amplifier 500 using a driving amplifier according to the present invention has three operating regions. It is set in a first operating region that only the driving carrier amplifier 502($a$), the first power distributor 503, the carrier amplifier 504, and the first λ/4 transmission line 511 operate; it is set in a second operating region that the driving peaking amplifier 502($b$), the second power distributor 506, and the first peaking amplifier 507 operate additionally; and it is set in a third operating region that the second peaking amplifier 509 operates further additionally.

Through the drawing, the 3-way Doherty power amplifier using a driving amplifier according to the present invention will be described in detail.

An input signal is divided through the hybrid power distributor 501 into signals which have the same amplitude and have a phase difference of 90 degrees, and into the respective transmission lines. In a first operating region in which an input signal has a low amplitude, it is set that only the driving carrier amplifier 502($a$) operates and the driving peaking amplifier 502($b$) does not operate.

In the first operating region, when the driving carrier amplifier 502($a$) operates, the carrier amplifier 504 also operates at the same time because the driving carrier amplifier 502($a$) and the carrier amplifier 504 are both set to have a class-AB bias.

Differently from the driving carrier amplifier 502($a$), the driving peaking amplifier 502($b$) is set to have a deep class-C bias. An amplifier using a class-AB bias operates at a lower input power than another amplifier using a deep class-C bias. Therefore, even in a section where an amplifier using the class-AB bias generates an output power, a section where another amplifier using the deep class-C bias does not generate an output power exists. For example, it can be understood in FIG. 4 that "$V_{GSd}$=deep class-C", and all amplifiers using "$V_{GSd}$=class-AB" generate output powers in a section before an output power of "$V_{GSm}$=weak class-C" is generated. That is to say, there exists a section in which an amplifier using "$V_{GSd}$=deep class-C" does not generate an output power.

Referring to the graph in FIG. 4, it can be identified that an amplifier using a class-AB bias and an amplifier using a deep class-C bias operate such that regions in which output power according to input power is generated are different from each other.

An input signal passing through the driving carrier amplifier 502($a$) is divided into two signals having the same amplitude and phase by the first power distributor 503, wherein one signal is inputted to the carrier amplifier 504, and the other signal is terminated. In order to represent the terminating operation, one of two signals obtained by the dividing operation of the first power distributor 503 is illustrated as an arrow for convenience.

The first power distributor 503 allows signals, which are to be inputted to the carrier amplifier 504, first peaking amplifier 507, and second peaking amplifier 509, to have the same amplitude and phase. Since the output impedance for a signal amplified by the carrier amplifier 504 has increased by the first λ/4 transmission line 511, the signal amplified by the carrier amplifier 504 can generate a high efficiency in a low output power range.

As the amplitude of an input signal increases gradually, the driving peaking amplifier 502($b$) comes to operate. The input signal, which has passed through the driving peaking amplifier 502($b$), is separated into two signals having the same magnitude and phase by the second power distributor 506 and is divided into the respective transmission lines.

Since the first peaking amplifier 507 and the second peaking amplifier 509 are set to a weak class-C bias and a deep class-C bias, respectively, the first peaking amplifier 507 operates first, and then the second peaking amplifier 509 operates.

A section in which the first peaking amplifier 507 operates corresponds to the second operating region, and a section in which the second peaking amplifier 509 additionally operates corresponds to the third operating region.

Such operating regions are specifically illustrated in FIG. 6 to be described later. Due to such a difference that the operating time points of the two peaking amplifiers are different from each other, an output signal of the second path unit can maintain a higher efficiency than an output signal of the first path unit until arriving at a saturation output power.

As well known, a Doherty amplifier includes an amplifier using a transistor, which may cause a soft turn-on phenomenon. The soft turn-on phenomenon is a non-linear characteristic of general amplifiers, and such a characteristic is exhibited in all transistors. This means a phenomenon where, in spite that the output of an amplifier has to linearly increase when the amplifier is turned on, the output is amplified slowly at first due to the non-linear characteristic in the element, and is linearly amplified after a few period of time has passed.

In the Doherty amplifier according to the present invention, the detailed circuit structures of the carrier amplifier, the peaking amplifier, etc. are configured in the form of an inverse class-E power amplifier, as shown in FIG. 2, regardless of the types of amplifiers. This is an amplifier using a transistor, which has advantages of controlling the harmonic component of a signal and having a high efficiency, whereas causing the soft turn-on phenomenon.

However, as shown in FIG. 5, when the driving amplifier 502 is added to the first stage of the Doherty amplifier while the detailed structures of all amplifiers in the Doherty amplifier according to the present invention take the same structure as that of an inverse class-E power amplifier, it is possible to compensate for the soft turn-on phenomenon as described above.

The driving amplifier 502, the carrier amplifier 504, the first peaking amplifier 507, and the second peaking amplifier 509 are configured in series. The driving carrier amplifier 502(a) and driving peaking amplifier 502(b) constituting the driving amplifier 502 are set to be mutually differently biased, and thus generate output powers at different time points depending on the range of an input power.

In order to compensate for the soft turn-on phenomenon, the driving peaking amplifier 502(b) is connected in series between the first peaking amplifier 507 and the second peaking amplifier 509 and is used. Since the first peaking amplifier and second peaking amplifier use the driving peaking amplifier 502(b) connected in series thereto, the slope increases more steeply upon being turned on, thereby preventing the efficiency from decreasing due to the soft turn-on phenomenon.

In addition, when the first peaking amplifier and the second peaking amplifier operate at the same time, the efficiency may be dropped in a course of obtaining the peak value of the efficiency and again arriving at a saturation state. In order to solve such a problem, the first and second peaking amplifiers are designed such that the first peaking amplifier operates first and then the second peaking amplifier operates in regular sequence, thereby obtaining and maintaining the peak value of the efficiency.

As described above, the 3-way Doherty power amplifier using a driving amplifier to compensate for the soft turn-on phenomenon can obtain a higher efficiency than the other power amplifiers.

The amplitude of an input signal which operates only the driving carrier amplifier 502(a) and carrier amplifier 504 is relatively small as compared with that of an input signal to start the operation of the driving peaking amplifier 502(b).

In order to prevent the output power of the carrier amplifier 504 from leaking to the first peaking amplifier 507 and second peaking amplifier 509, the second transmission line 508 and third transmission line 510 are connected to the output terminals of the first peaking amplifier 507 and second peaking amplifier 509, respectively.

In order to compensate for a phase difference caused by the second transmission line 508 and third transmission line 510, the first transmission line 505 is added to the output terminal of the carrier amplifier 504.

In order to achieve an impedance matching between the characteristic impedance of the 3-way Doherty power amplifier and the output impedance of the carrier amplifier 504, first peaking amplifier 507, and the second peaking amplifier 509, the output impedance transformation transmission line 512 is connected to the output.

Figure 6:
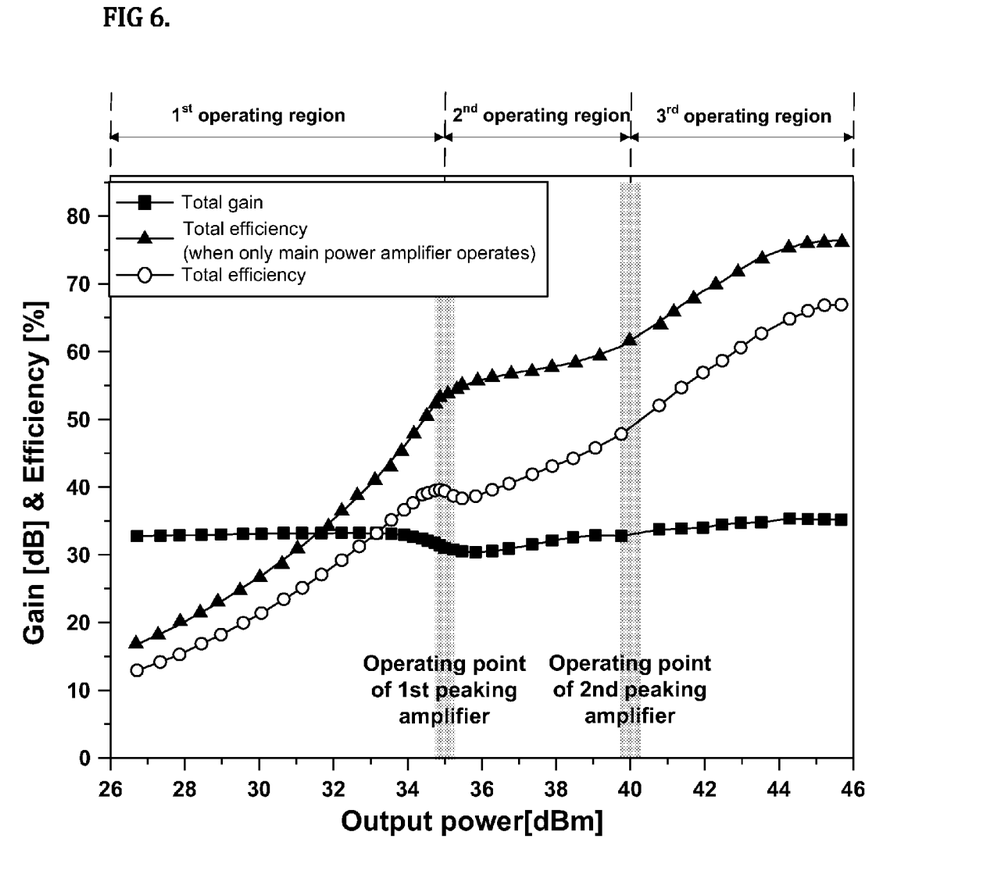
FIG. 6 is a view illustrating the efficiency and gain characteristic in accordance with output powers when a sine wave having a center frequency of 1 GHz is used as an input signal according to the present invention.

FIG. 6 is a view illustrating the efficiency and gain characteristic in accordance with output powers when a sine wave having a center frequency of 1 GHz is used as an input signal according to the present invention. It can be identified that, unlike the conventional Doherty amplifiers in which the efficiency and gain thereof decrease after a high efficiency is achieved at a wide BOP domain, the Doherty amplifier according to the present invention maintains a higher efficiency than those of the conventional Doherty amplifiers even after achieving the higher efficiency, and also constantly maintains the gain thereof at a high value without decrease.

Making a specific comparison between the circuit of FIG. 5 and the graph of FIG. 6 in detail, in the first operating region in which the driving carrier amplifier 502(a), first power distributor 503, and carrier amplifier 504 according to the first path unit operate, an output power (total average power) is equal to or less than 35.02 dBm, and a total drain efficiency of 39.38% and a total gain of 31.02 dB are exhibited when the output power (total average power) is 35.02 dBm.

The second operating region, in which the driving peaking amplifier 502(b) and first peaking amplifier 507 of the second path unit operate in addition to the first path unit, starts from when the output power (total average power) is 35.02 dBm.

The third operating region, in which even the second peaking amplifier 509 of the second path unit starts operating, starts from when the output power (total average power) is 39.76 dBm, so that all amplifiers operate in the third operating region.

When an output power (total average power) is 39.76 dBm, a total drain efficiency of 47.78% and a total gain of 32.76 dB are obtained; and when an output power (total average power) is 45.68 dBm, a total drain efficiency of 66.82% and a total gain of 35.18 dB are obtained.

As is apparent from the above description, the present invention provides a 3-way Doherty power amplifier using a driving amplifier overcomes a limitation that the efficiency and gain decrease after a high efficiency is exhibited at a high BOP, so that it is possible to obtain a high efficiency and gain even in a wide output range. In addition, as the soft turn-on phenomenon is overcome by the driving amplifier, it is possible to maintain a high efficiency by operating the peaking amplifier to generate the maximum output power.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A 3-way Doherty power amplifier comprising:
a first path unit and a second path unit which are divided from an input terminal;
a driving carrier amplifier connected to the first path unit;
a carrier amplifier connected to the driving carrier amplifier;
a second $\lambda/4$ transmission line connected to the second path unit;
a driving peaking amplifier connected to the second $\lambda/4$ transmission line;
first and second peaking amplifiers connected in common to an output terminal of the driving peaking amplifier;
a first $\lambda/4$ transmission line connected to the carrier amplifier; and
an output terminal to which the first $\lambda/4$ transmission line, the first peaking amplifier, and the second peaking amplifier are connected in common,
wherein it is set in a first operating region that only the driving carrier amplifier and the carrier amplifier operate, it is set in a second operating region that the driving peaking amplifier and the first peaking amplifier operate additionally, and it is set in a third operating region that the second peaking amplifier operates further additionally.

2. The 3-way Doherty power amplifier according to claim 1, wherein the first $\lambda/4$ transmission line and the second $\lambda/4$ transmission line are connected to an output of the carrier amplifier and an input of the driving peaking amplifier, respectively, for impedance matching.

3. The 3-way Doherty power amplifier according to claim 1, wherein the input signal of the second operating region has a larger amplitude than the input signal of the first operating region.

4. The 3-way Doherty power amplifier according to claim 1, wherein the input signal of the third operating region has a larger amplitude than the input signal of the second operating region.

5. The 3-way Doherty power amplifier according to claim 1, wherein the driving peaking amplifier is biased to operate in a deep class-C region.

6. The 3-way Doherty power amplifier according to claim 1, wherein the first peaking amplifier and the second peaking amplifier are biased to operate in a weak class-C region and a deep class-C region, respectively.

7. The 3-way Doherty power amplifier according to claim 2, wherein the first $\lambda/4$ transmission line and second $\lambda/4$ transmission line are configured to delay the phase of the input signal by ¼ period.

8. The 3-way Doherty power amplifier according to claim 1, wherein the first path unit and the second path unit are divided by a hybrid power distributor.

9. The 3-way Doherty power amplifier according to claim 1, wherein a first power distributor and a second power distributor are connected to an output of the driving carrier amplifier and an output of the driving peaking amplifier, respectively.

10. The 3-way Doherty power amplifier according to claim 1, wherein a first power distributor, a second power distributor, and a third power distributor are connected to an output of the carrier amplifier, an output of the first peaking amplifier, and an output of the second peaking amplifier, respectively.

11. The 3-way Doherty power amplifier using a driving amplifier according to claim 10, wherein the carrier amplifier is configured with an inverse class-E power amplifier.

12. The 3-way Doherty power amplifier using a driving amplifier according to claim 10, wherein the first peaking amplifier is configured with an inverse class-E power amplifier.

13. The 3-way Doherty power amplifier using a driving amplifier according to claim 10, wherein the first peaking amplifier comprises a transmission line which is configured to prevent output power of the carrier amplifier from leaking toward the first peaking amplifier when the first peaking amplifier does not operate.

14. The 3-way Doherty power amplifier using a driving amplifier according to claim 10, wherein the second peaking amplifier is configured with an inverse class-E power amplifier.

15. The 3-way Doherty power amplifier using a driving amplifier according to claim 10, wherein the second peaking amplifier comprises a transmission line which is configured to prevent output power of the carrier amplifier from leaking toward the second peaking amplifier when the second peaking amplifier does not operate.

16. The 3-way Doherty power amplifier using a driving amplifier according to claim 8, wherein the hybrid power amplifier comprises the second $\lambda/4$ transmission line.

* * * * *